United States Patent

[11] 3,568,761

[72] Inventor Robert Steven Berger
Edison, N.J.
[21] Appl. No. 826,239
[22] Filed May 20, 1969
[45] Patented Mar. 9, 1971
[73] Assignee RCA Corporation

[54] SEMICONDUCTOR MOUNTING ADAPTER
8 Claims, 9 Drawing Figs.

[52] U.S. Cl. .................................................... 165/80, 165/185, 317/100, 317/234
[51] Int. Cl. .................................................... H011 1/12
[50] Field of Search ........................................ 317/100, 234/1; 165/80, 185

[56] References Cited

UNITED STATES PATENTS

| | | | |
|---|---|---|---|
| 2,994,203 | 8/1961 | Lackey et al. ................ | 62/3 |
| 3,150,298 | 9/1964 | Andres ........................ | 317/234 |
| 3,206,646 | 9/1965 | Relation et al. ............... | 317/100 |
| 3,213,336 | 10/1965 | McAdam ...................... | 317/234 |
| 3,377,525 | 4/1968 | Bradstock .................... | 317/234 |
| 3,417,300 | 12/1968 | Kauffman ..................... | 165/80X |

*Primary Examiner*—Albert W. Davis, Jr.
*Attorney*—Glenn H. Bruestle

ABSTRACT: A semiconductor mounting adapter comprising a base member joined to a threaded stud, and a support member joined to the base member. The support member has a mounting surface, a thick region adjacent to the base member which provides good heat dissipation characteristics, and means for mounting an encapsulated semiconductor device onto the mounting surface.

INVENTOR
ROBERT STEVEN BERGER

BY [signature]
ATTORNEY

INVENTOR
ROBERT STEVEN BERGER

BY [signature]
ATTORNEY

INVENTOR
ROBERT STEVEN BERGER

BY [signature]
ATTORNEY

SEMICONDUCTOR MOUNTING ADAPTER

BACKGROUND OF THE INVENTION

The present invention relates to mounting means for semiconductor devices, and relates in particular to mounting adapters for high power devices, such as power transistors.

Power transistors previously known in the art are permanently mounted into a stud package. When a unit is no longer usable, the entire unit, including transistor and stud package, must be replaced. Further, during production of power transistors by the manufacturer, the final testing cannot be made until the entire device is fabricated. If a given unit is rejected, then the transistor pellet, package, and mount become unusable.

It is therefore desirable to employ a mounting adapter to which an encapsulated power transistor may be easily mounted and removed. Thus, when the unit is no longer usable or is rejected during production, only the encapsulated transistor need be replaced or rejected. However, one of the severe problems associated with such a mounting adapter is to provide for the dissipation of the heat generated by the power transistor during operation.

SUMMARY OF THE INVENTION

The present invention comprises a semiconductor mounting adapter having a threaded stud, a base member, and a support member. The base member has an upper surface, a lower surface, and edge surfaces. The threaded stud is joined to the base member at the lower surface, and the support member is joined to the base member at the upper surface.

The support member has a mounting surface offset a predetermined distance from an edge surface of the base member. The support member also has a thick region between the mounting surface and the opposite edge surface of the base member which provides good heat conductivity between the mounting surface and the base member; and a thin region extending beyond the thick region of the support member.

The mounting adapter also includes means for mounting an encapsulated semiconductor device onto the mounting surface of the support member.

THE DRAWING

FIGS. 1*a*, *b*, and *c* illustrate the side, front, and top views of a mounting adapter constructed in accordance with the present invention.

FIGS. 2*a*, *b*, and *c* illustrate the side, front, and top views of the mounting adapter, with a partially cut away encapsulated semiconductor device mounted in place.

FIGS. 3*a* and *b* illustrate the side and front views of another embodiment of the mounting adapter, with a partially cut away encapsulated semiconductor device mounted in place.

FIG. 4 illustrates a third embodiment of the mounting adapter, with an encapsulated semiconductor device mounted in place.

DETAILED DESCRIPTION

Figure 1A:
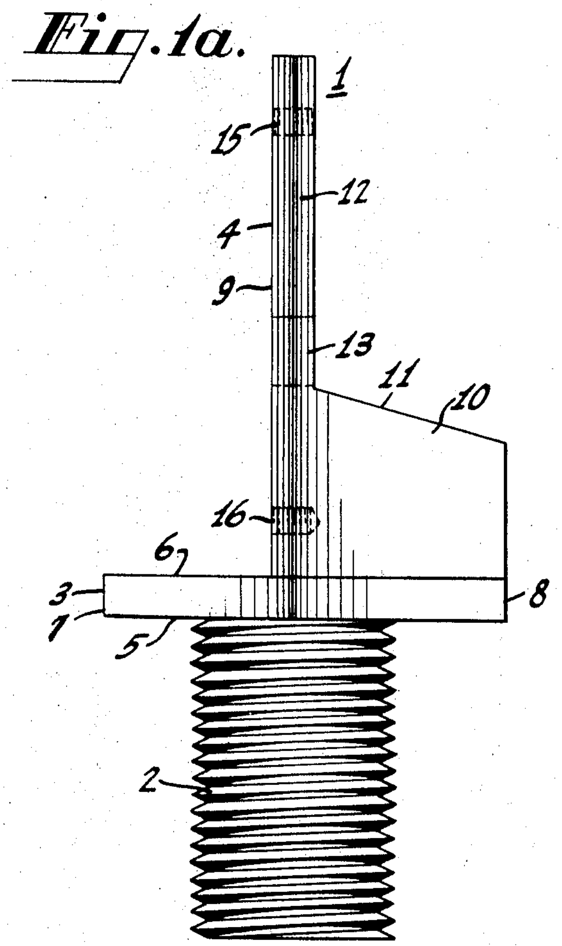
Figure 1B:
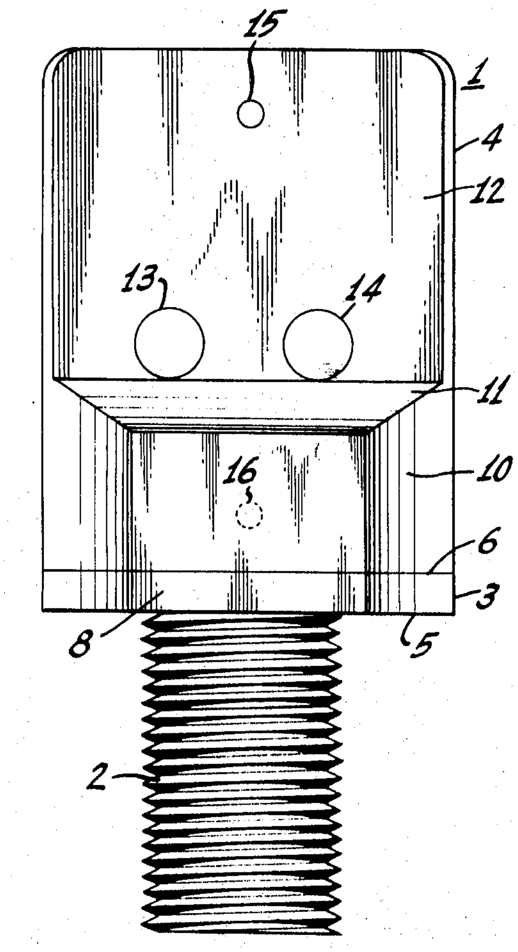

A preferred embodiment of the mounting adapter will now be described with reference to FIGS. 1*a*, *b*, and *c*.

Figure 1C:
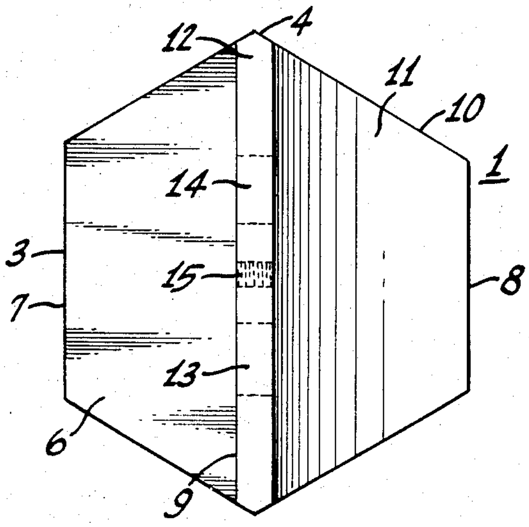

The mounting adapter 1 comprises a threaded stud 2, a base member 3, and a support member 4. The threaded stud 2 is joined to the base member 3 at the base member's lower surface 5. The support member 4 is joined to the base member 3 at the base member's upper surface 6, and extends in a direction normal to said upper surface. As illustrated in the top view, FIG. 1*c*, the outline of the base member 3 is hexagonal. Therefore, the base member 3 has six edge surfaces, of which opposing edge surfaces 7 and 8 are two.

The support member 4 has a mounting surface 9 which is offset from the edge surface 7 of the base member 3 a distance determined by the dimensions of the encapsulated semiconductor device to be mounted on the adapter 1, and will hereinafter be described with reference to FIGS. 2*a*—*c*. The support member 4 also has a thick region 10 between the mounting surface 9 and the edge surface 8 of the base member 3. When an encapsulated semiconductor device such as a power transistor is mounted onto the mounting surface 9, the thick region 10 provides a path of good heat conductivity between the mounting surface 9 and the base member 3, thus providing good heat dissipation characteristics between the power transistor and the infinite heat sink into which the adapter 1 is mounted during use. Preferably, the top surface 11 of the thick region 10 is slightly tapered.

Further, the support member 4 has a thin region 12 which extends beyond the thick region 10. The thin region 12 is provided with two lead apertures 13 and 14. The thin region 12 is also provided with a threaded mounting hole 15, and a second threaded mounting hole 16 is provided in the thick region 10 on the mounting surface 9. The dimensions and locations of the lead apertures 13 and 14, and the threaded mounting holes 15 and 16 are also dependent on the size and configuration of the encapsulated semiconductor device to be mounted on the adapter 1, as will be later evident from the discussion of FIGS. 2*a*—*c*.

The exact dimensions of the threaded stud 2, the base member 3, and the support member 4 are not critical. However, the following range of dimensions are comparable with present commercially available power devices, and are therefore preferred. The threaded stud 2 is between 0.781 to 0.828 inches long, has an outside diameter of 0.500 inches, and is threaded 20 threads to the inch. The hexagonal base member 3 is between 1.057 to 1.067 inches wide from any edge surface to the opposing edge surface, and is 0.150 inches thick between the lower surface 5 and the upper surface 6. The overall extension of the support member 4, to the extreme of its thin region 12, is between 1.590 to 1.600 inches; the width of the thin region 12 is between 0.120 to 0.130 inches. The thick region 10 of the support member 4 extends above the upper surface 6 of the base member 3 between 0.057 to 0.570 to 0.580 inches, and tapers forward to a dimension between 0.440 to 0.450 inches on the front surface of the support member 4.

The adapter 1 may be fabricated in an integral unit by machining a solid piece of hexagonal metal stock to form the threaded stud 2, the base member 3, and the support member 4; or, the stud, base member, and support member may be individually machined, and then brazed or welded together to form an integral unit. However, fabrication from a solid piece of hexagonal metal stock provides better thermal conductivity, and is therefore preferred. The metal may be any base metal or alloy having high thermal conductivity; for instance, copper or aluminum may be used. However, it is preferred to use copper which has been nickel plated by any electroless plating method.

The manner in which an encapsulated semiconductor device, for instance a power transistor, is mounted onto the mounting adapter in the preferred embodiment will now be described with reference to FIGS. 2*a*, *b*, and *c*.

The power transistor 20 comprises a header 21 onto which a pedestal 22 is mounted. A transistor pellet 23 is mounted on the pedestal 22. Small metal connecting plates **24*a* and 24*b* provide electrical paths between the diffusion regions of the pellet 23 and the transistor leads 25 and 26, respectively. The transistor 20 is completed with a metallic "can," or cover, 27 which encapsulates the pellet 23, pedestal 22, and metal plates 24*a* and 24*b***. In FIG. 2*a*, part of the cover 27 is cut away to show the positioning of the pellet. In FIG. 2*b*, the pedestal 22, pellet 23, cover 27, metal plates **24*a*—*b*, and the outline of the transistor 20**, are represented by dotted lines.

The transistor 20 is mounted on the mounting surface 9 of the support member 4 by means of threaded mounting screws 28 and 29 which are compatible with the threaded mounting holes 15 and 16 of the support member 4. The transistor leads 25 and 26 pass through the lead apertures 13 and 14 of the support member 4, and are easily accessible because of the tapered surface 11 of the thick region 10.

Figure 2A:
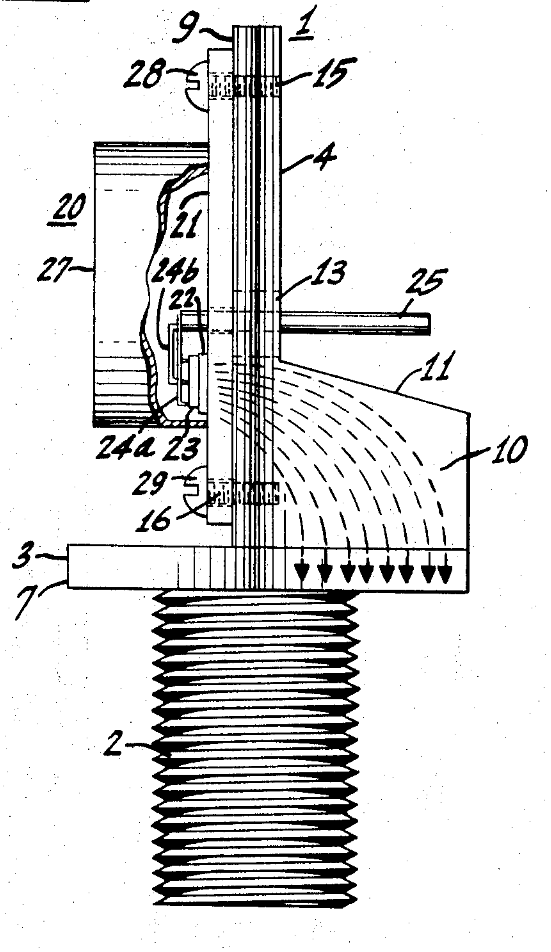
Figure 2B:
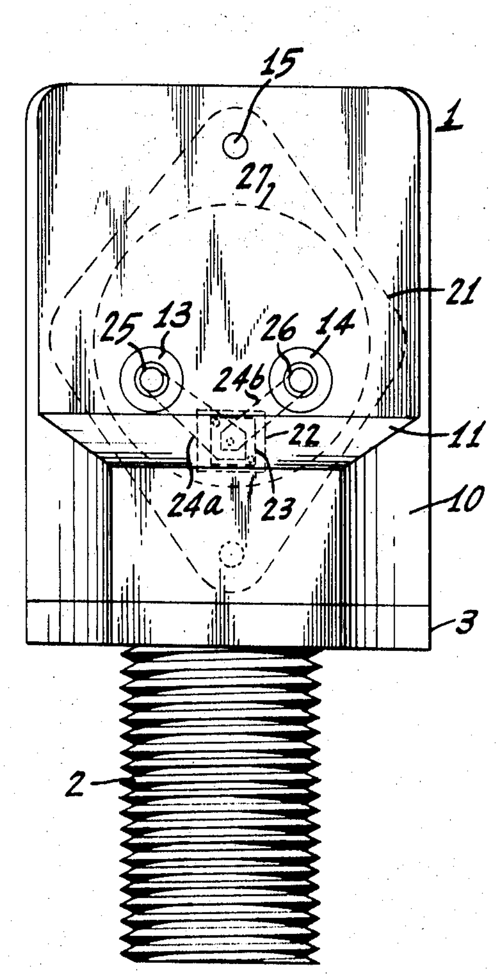
Figure 2C:
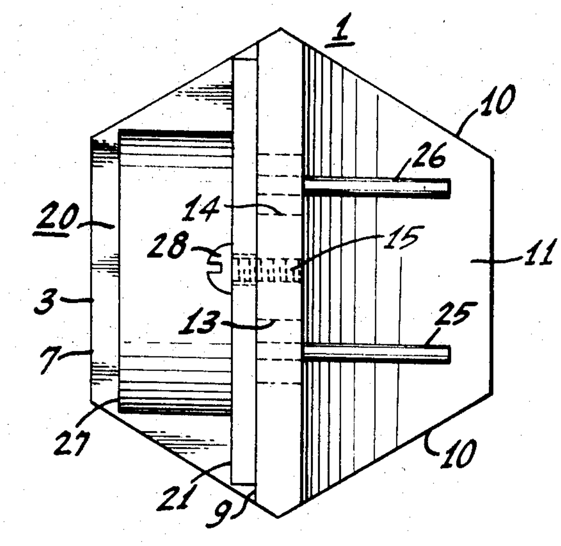

The dotted arrows illustrated in FIG. 2*a* represent the path of heat dissipation between the transistor pellet 22 and the base member 3. It has been found that the configuration of the thick region 10 illustrated in FIGS. 2*a*, 2*b*, and 2*c*, provides heat dissipation between the mounting surface 9 and the base member 3 of 0.2—0.3° C. per watt, which compares favorably with prior art mounting means.

As described previously, the dimensions and locations of the lead apertures 13 and 14 and the threaded mounting holes 15 and 16 depend on the dimensions of the power device to be mounted on the mounting surface 9. For example, one type of power transistor package for which the mounting adapter is particularly useful will be recognized by one skilled in the art by its JEDEC designation, TO–3. The TO–3 package is used to encapsulate power transistors which develop power in the range of 100 watts. In order to mount a TO–3 package to the mounting surface 9 of the adapter 1, the lead apertures 13 and 14 and the threaded holes 15 and 16 would simply be provided according to the particular manufacturer's specifications.

Further, the distance that the mounting surface 9 is offset from the edge surface 7 is also determined by the dimensions of the power device to be mounted. Preferably, the mounting surface 9 is offset a distance which will allow the adapter 1, with the device 20 mounted, to maintain the original hexagonal configuration of the adapter, as shown in FIG. 2*c*. This particular feature allows the device adapter combination to be easily fitted into inaccessible chassis locations by using a deep-socket hexagonal wrench.

Figure 3A:
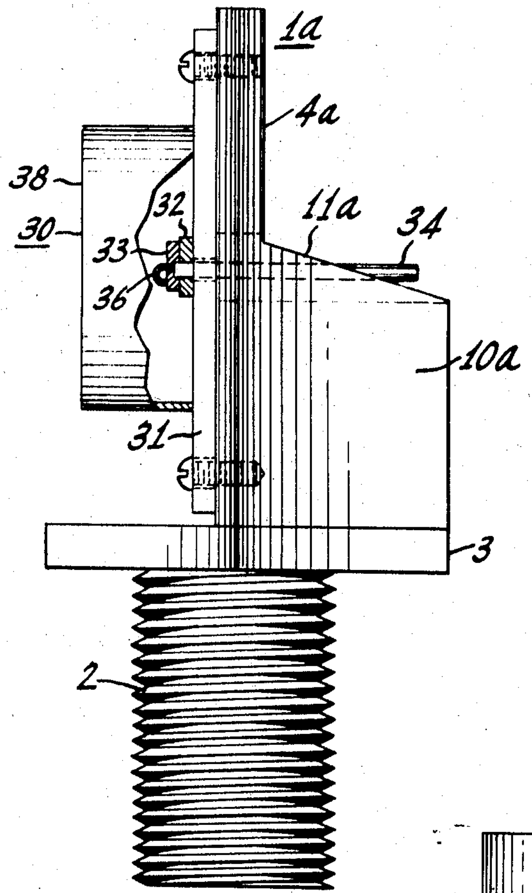
Figure 3B:
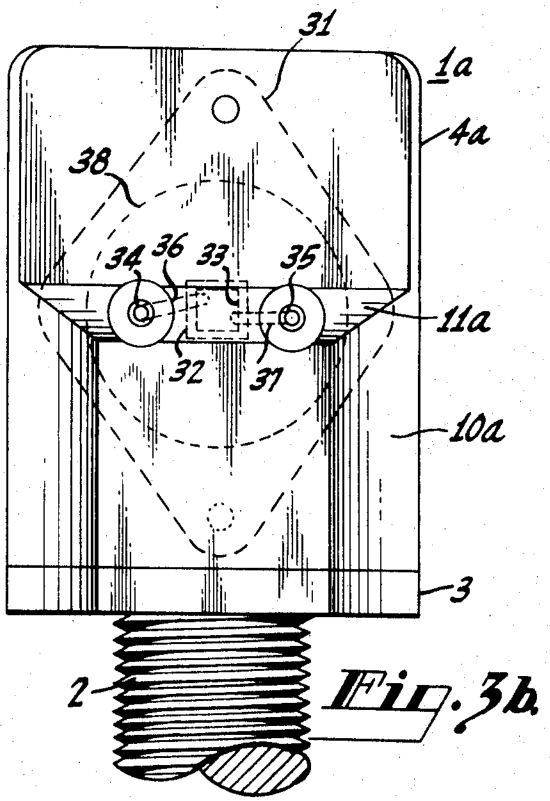

As illustrated in FIGS. 2*a* and *b*, the top edge of the tapered surface 11 of the thick region 10 is designed to extend to or beyond the top edge of the transistor pellet 23 to provide a path of good heat conductivity. Since, in most power transistors the pellet 23 is mounted below the lead-to-lead centerline, the preferred embodiment of the mounting adapter is easily conformable to a variety of power transistors having the general configuration illustrated. However, other types of power devices, such as power diodes, may employ a pellet of semiconductor material which is mounted between the leads. FIGS. 3*a* and *b* illustrate the manner in which the mounting adapter is modified to be employed with such a device.

The device 30, for instance a power diode, comprises a base 31 onto which a pedestal 32 is mounted. A diode pellet 33 is mounted onto the pedestal 32. Diode leads 34 and 35 are electrically connected to the different regions of the diode pellet 33 by means of connecting leads 36 and 37. The pedestal 32 and pellet 33 are physically located between the two leads 34 and 35. The diode 30 is completed with a metallic cover 38, which is partially cut away in FIG. 3*a* to show the positioning of the pedestal 32, pellet 33, and connecting leads 36 and 37.

In order to provide a path of good heat conductivity between the diode pellet 33 and the base member 3, the support member 4*a* of the modified adapter 1*a* has a thick region 10*a* which is extended above the base member 3. The top leading edge of the tapered surface 11*a* is level with the top of the diode pellet 33, thus providing the desired path of heat conductivity.

Figure 4:
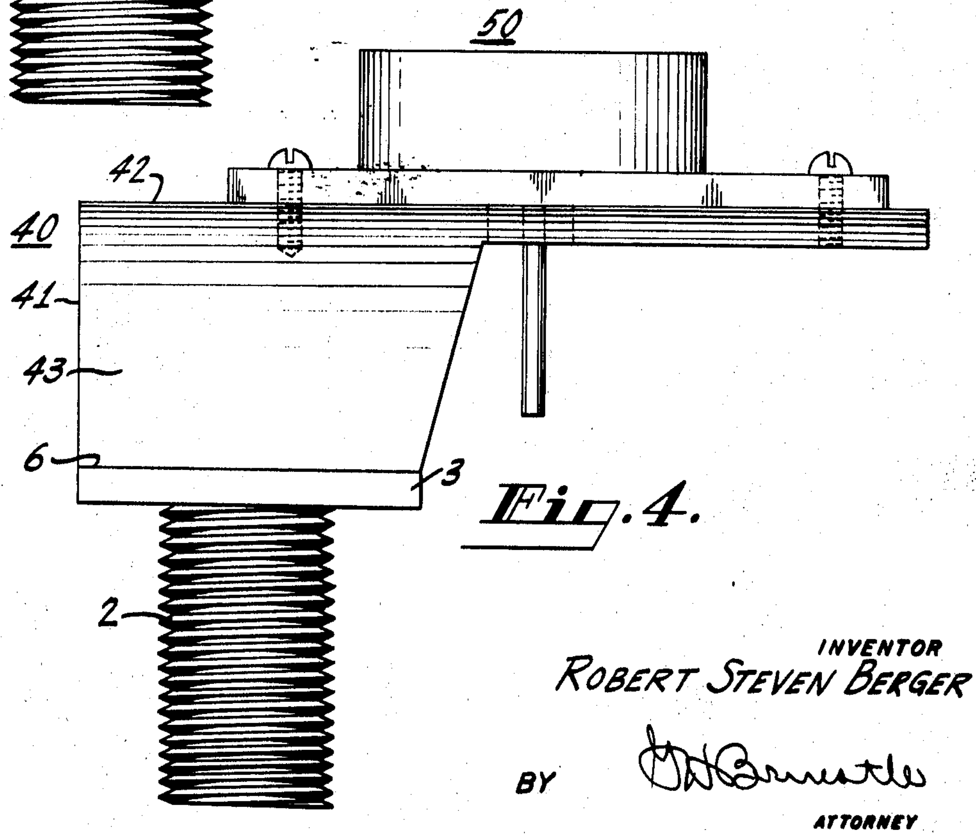

FIG. 4 illustrates another embodiment of the mounting adapter, in which the mounted device is mounted parallel to the upper surface of the base member. The adapter 40 has a threaded stud 2 and base member 3, as previously described. The support member 41 has a mounting surface 42 which is parallel to the upper surface 6 of the base member 3; and is separated from the upper surface by a thick region 43, which provides a path of good heat dissipation between the mounting surface 42 and the base member 3. An encapsulated semiconductor device 50 is mounted on the mounting surface 42 in the manner previously described.

I claim:

1. A semiconductor device mounting arrangement comprising:

a threaded stud, a base member, and a support member;

said base member having an upper surface, a lower surface, and edge surfaces, with the threaded stud joined to the base member at said lower surface;

said support member joined to the base member at said upper surface, the support member having:

a mounting surface offset a predetermined distance from one of said edge surfaces of the base member;

a thick region between said mounting surface and the opposite edge surface of the base member which provides good heat conductivity between the mounting surface and the base member;

a thin region adjacent to and extending beyond the thick region, said thin region including a portion of said mounting surface; and an encapsulated semiconductor device having a device pellet mounted therein; and means for mounting said encapsulated semiconductor device onto the mounting surface of the support member, with a portion of the device pellet adjacent said thick region.

2. A semiconductor device mounting adapter according to claim 1, in which the threaded stud, the base member, and the support member comprise an integral metal unit.

3. A semiconductor device mounting adapter according to claim 1 in which the base member is adapted to mate with a mounting tool.

4. A semiconductor device mounting adapter according to claim 1, in which the support member extends from the base member in a direction normal to the upper surface of the base member.

5. A semiconductor device mounting adapter according to claim 1, including means for mounting an encapsulated semiconductor device having a plurality of leads, said means comprising:

a threaded mounting hole in said thin region of the support member, a threaded mounting hole in said thick region of the support member; and lead apertures in the thin region of the support member capable of receiving the leads of the encapsulated semiconductor device.

6. A semiconductor device mounting adapter according to claim 5, in which the thick region of the support member extends from the base member to the lead apertures of the support member.

7. A semiconductor device mounting arrangement comprising:

a threaded stud, a base member, and a support member;

said base member having an upper surface and a lower surface, with the threaded stud joined to the base member at said lower surface;

said support member joined to the base member at said upper surface, said support member comprising:

a mounting surface separated from said upper surface by a thick region which provides good heat conductivity between the mounting surface and the base member; and a thin region adjacent to and extending beyond the thick region, said thin region including a portion of said mounting surface;

an encapsulated semiconductor device having a device pellet mounted therein; and means for mounting said encapsulated semiconductor device onto the mounting surface of the support member, with a portion of the device pellet adjacent said thick region.

8. A semiconductor device mounting adapter according to claim 7, in which the mounting surface is parallel to the upper surface of the base member.